United States Patent
Ishimaru

(10) Patent No.: US 7,468,923 B2
(45) Date of Patent: Dec. 23, 2008

(54) SEMICONDUCTOR INTEGRATED CIRCUIT

(75) Inventor: Kazunari Ishimaru, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 11/613,460

(22) Filed: Dec. 20, 2006

(65) Prior Publication Data

US 2007/0147138 A1    Jun. 28, 2007

(30) Foreign Application Priority Data

Dec. 28, 2005    (JP)    ............... 2005-379561

(51) Int. Cl.
*G11C 7/00*    (2006.01)
(52) U.S. Cl. .............. 365/189.11; 365/189.07; 365/191
(58) Field of Classification Search ............. 365/189.07, 365/189.011, 189.16, 191
See application file for complete search history.

(56) References Cited

U.S. PATENT DOCUMENTS

| 6,141,770 | A | 10/2000 | Fuchs et al. |
| 6,504,411 | B2 | 1/2003 | Cartagena |
| 6,573,774 | B1 | 6/2003 | Gardner |
| 2005/0232001 | A1* | 10/2005 | Tsuji .......................... 365/158 |
| 2006/0095823 | A1* | 5/2006 | Fujiwara ..................... 714/738 |

FOREIGN PATENT DOCUMENTS

JP    63-49860    3/1988

* cited by examiner

*Primary Examiner*—Thong Q Le
(74) *Attorney, Agent, or Firm*—Oblon, Spivak, McClelland, Maier & Neustadt, P.C.

(57) ABSTRACT

There is provided a semiconductor integrated circuit including a logic circuit and a writing circuit configured to receive a writing data outputted from the logic circuit, invert the writing data to generate an inverted data, compare the writing data with the inverted data and output the held writing data if the writing data is different from the inverted data.

16 Claims, 9 Drawing Sheets

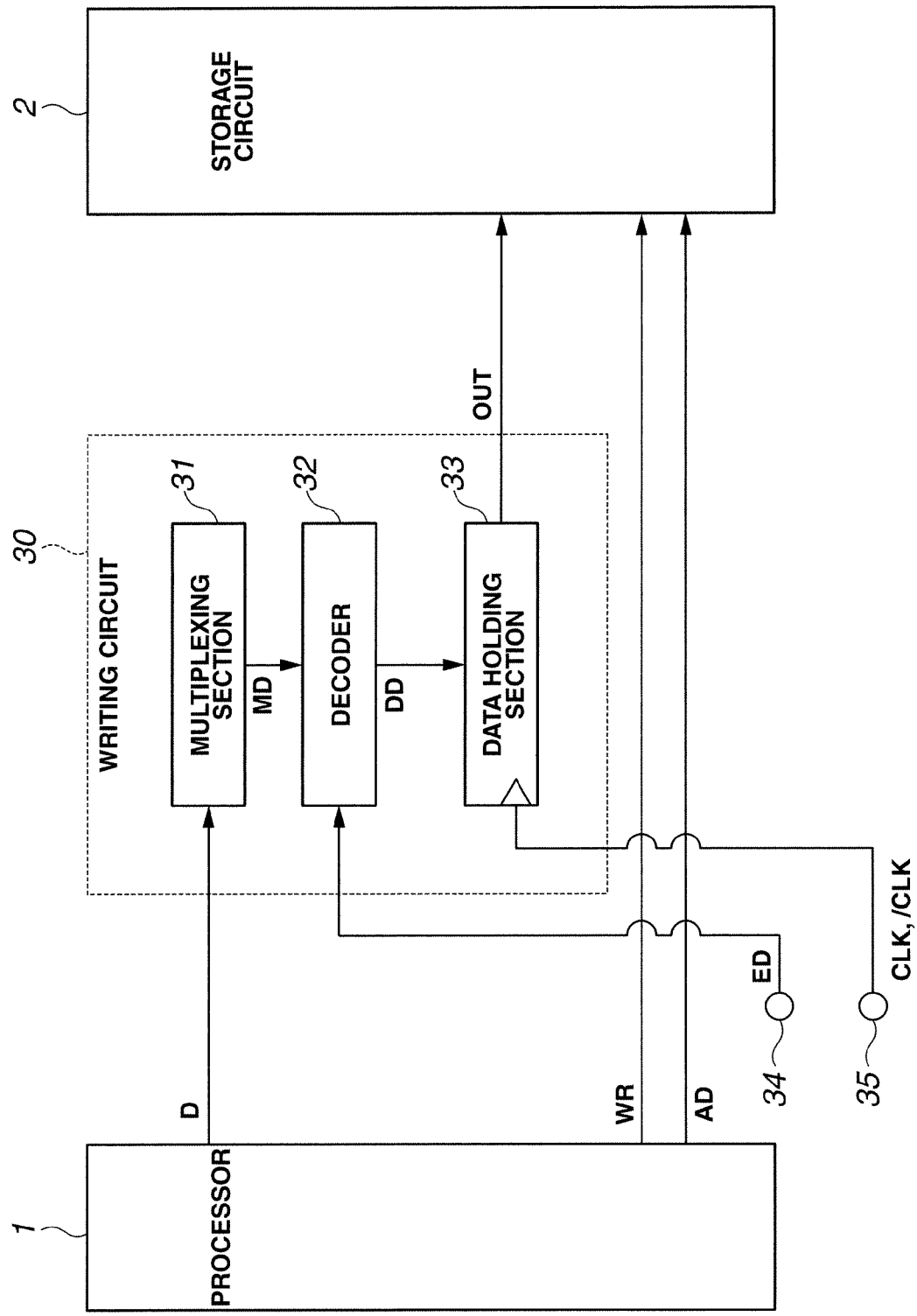

SEMICONDUCTOR INTEGRATED CIRCUIT

CROSS REFERENCE TO RELATED APPLICATION

This application is based upon and claims the benefit of priority from the prior Japanese Patent Application No. 2005-379561 filed on Dec. 28, 2005; the entire contents of which are incorporated herein by reference.

BACKGROUND OF THE INVENTION

1. Field of the Invention

The present invention relates to a semiconductor integrated circuit, and in particular, to a semiconductor integrated circuit into the storage circuit of which data can be written.

2. Description of the Prior Art

It has been known that a very small amount of a radioactive material contained in a package or radioactive rays radiated from solder when a chip is mounted on a substrate cause a nondestructive malfunction, so-called "soft error" in a semiconductor integrated circuit. It has also been known that cosmic rays, in particular, neutron beams cause the same malfunction in a semiconductor integrated circuit. A soft error in a semiconductor element can cause failure of an entire system. For this reason, in a system requiring high reliability, the use of elements highly resistive to a soft error and circuit design are implemented.

Error Correcting Code (ECC) has been proposed to protect circuitry in a memory element from a soft error. In ECC, parity data into which some data are put together is stored in another region when data is stored in a memory element to compare the data stored in the memory and the parity data, thereby detecting an error. If an error is detected, anew data is again overwritten. The ECC is effective for the memory element, but it increases the overhead of a circuit when applied to a small-capacity storage circuit such as a latch circuit in logic circuits.

As another method, there has been a device in which the same data is stored in a plurality of latch circuits and the stored data is compared when read to take a majority decision, thereby transmits correct data even if the stored data is destroyed by the soft error (refer to, for example, Japanese Patent Laid-Open No. 63-49860). A method in which a majority decision is taken requires three or more latch circuits to increase the circuit scale. For this reason, the conventional measure for preventing circuits from malfunctioning due to the soft error causes a problem of increasing the circuit scale.

SUMMARY OF THE INVENTION

According to one aspect of the present invention, there is provided a semiconductor integrated circuit which includes a logic circuit and a writing circuit configured to receive a writing data outputted from the logic circuit, invert the writing data to generate an inverted data, compare the writing data with the inverted data and output the writing data if the writing data and the inverted data are different from each other.

According to another aspect of the present invention, there is provided a semiconductor integrated circuit including a logic circuit and a writing circuit configured to sequentially generate the writing data outputted from the logic circuit plural times, overwrite and hold the writing data generated plural times and output the held writing data.

According to another aspect of the present invention, there is provided a semiconductor integrated circuit including a logic circuit and a writing circuit configured to multiplex the writing data outputted from the logic circuit, decode the multiplexed writing data, hold the decoded writing data and output the held writing data.

BRIEF DESCRIPTION OF THE DRAWINGS

FIG. 13 is a block diagram showing one example of a semiconductor integrated circuit related to a third embodiment of the present invention.

DETAILED DESCRIPTION OF THE EMBODIMENTS

Figure 1:
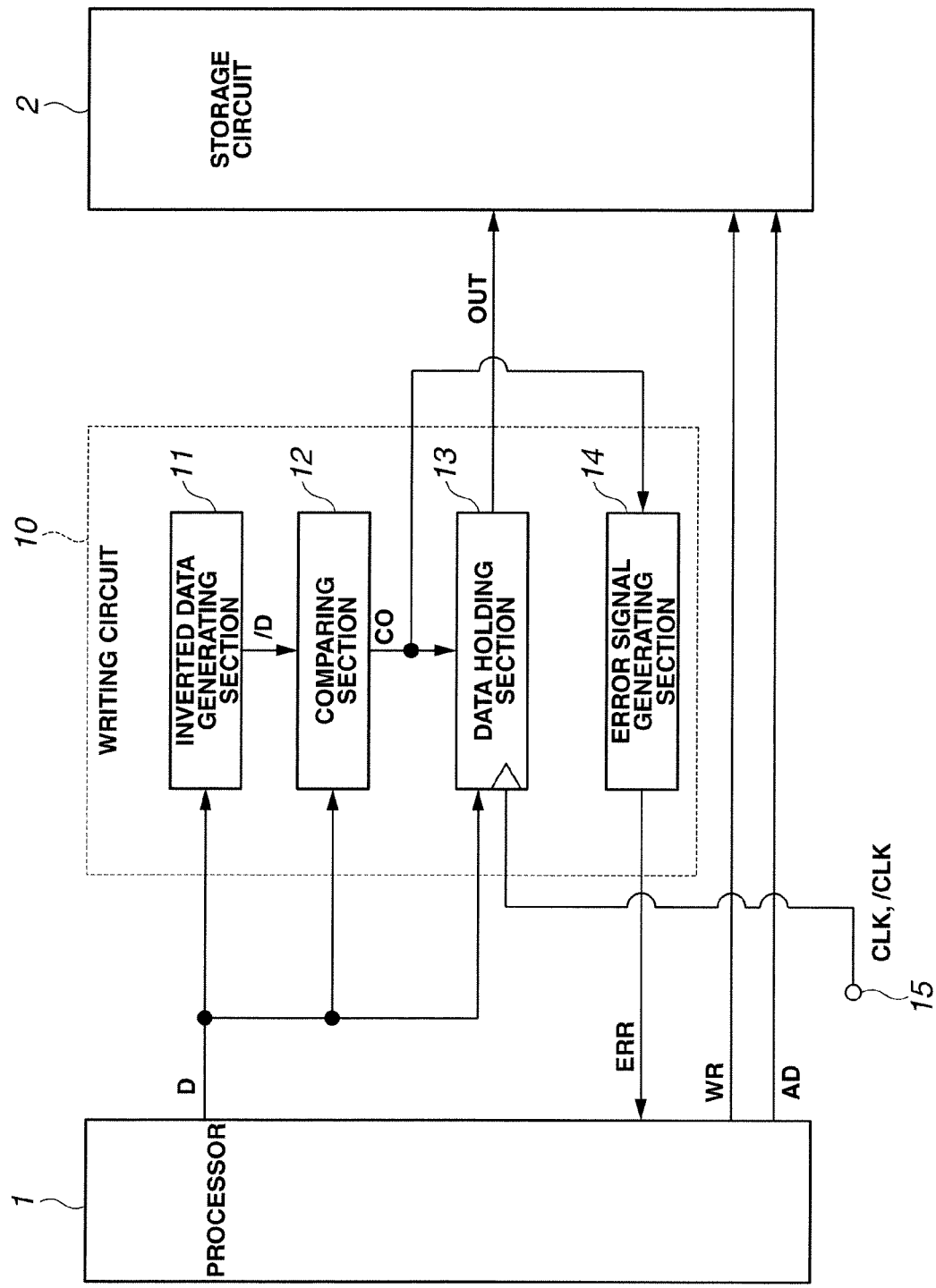
FIG. 1 is a block diagram showing one example of a semiconductor integrated circuit related to a first embodiment of the present invention.

Referring to the drawings, the first to the third embodiment are described below. In the description of the following drawings, the same or similar reference numerals and characters are given to the same or similar parts.

The following first to third embodiments discuss a logic circuit to prevent malfunction of a circuit due to a soft error, for example, an embodiment of preventing malfunction of a signal outputted from a processor. Incidentally, it is to be understood that a logic circuit to prevent malfunction is not limited to a processor.

First Embodiment

As shown in FIG. 1, the semiconductor integrated circuit related to the embodiment of the present invention includes a processor 1, a writing circuit 10 configured to receive a writing data D outputted from the processor 1, invert the writing data D to generate an inverted data /D, compare the writing data D with the inverted data /D and outputs the held writing data OUT if the writing data D and the inverted data /D are different from each other, and a storage circuit 2 configured to store the written data OUT outputted from the writing circuit 10.

The processor 1 generates the writing data D, an address signal AD to specify a memory address of the storage circuit 2 and a control signal WR to control writing, at the time of writing data. The writing data D outputted from the processor 1 is written into the memory element corresponding to the address in the storage circuit 2 specified by the address AD. If a soft error occurs when data is written into the storage circuit 2, the writing data D is inverted from "1" to "0" or from "0" to "1." For this reason, it is important to prevent the malfunction of a circuit caused by a soft error.

The writing circuit 10 includes an inverted data generating section 11 connected to the processor 1, a comparing section 12 connected to the processor 1 and the inverted data generating section 11, a data holding section 13 connected to the processor 1, the comparing section 12 and the storage circuit 2, an error signal generating section 14 connected to the processor 1 and the comparing section 12.

The inverted data generating section 11 inverts the writing data D outputted from the processor 1 to generate an inverted data /D. The inverted data generating section 11 generates, for example, "0" as an inverted data /D if the writing data D is "1" and generates "1" as an inverted data /D if the writing data D is "0."

Figure 2:
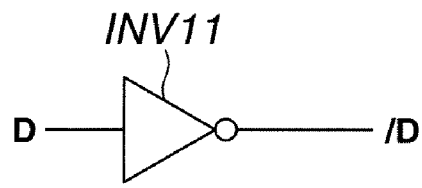
FIG. 2 is a circuit diagram showing one example of an inverted data generating section related to the first embodiment of the present invention.
Figure 3:
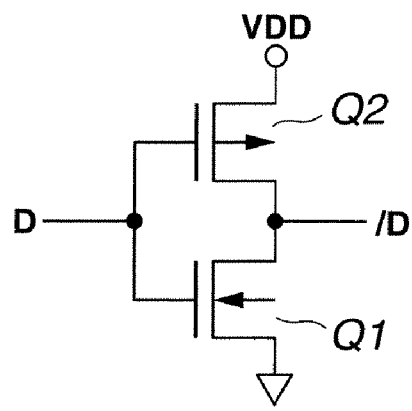
FIG. 3 is a circuit diagram showing one example of an inverter related to the first embodiment of the present invention.

An inverter INV 11 as shown in FIG. 2, for example, may be used as the inverted data generating section 11. The inverter INV 11, as shown in FIG. 3, is a CMOS inverter in which an nMOS transistor Q1 is connected in series to a pMOS transistor Q2. The source of the transistor Q1 is grounded and the source of the transistor Q2 is connected to a power supply VDD. The common gate of the transistors Q1 and Q2 is connected to the output terminal of the processor 1 and the common connecting point (common drain) of the transistors Q1 and Q2 is connected to one of the input terminal of the comparing section 12.

The comparing section 12 shown in FIG. 1 compares the writing data D with the inverted data /D to monitor whether the writing data D is always different from the inverted data /D, that is to say, whether a soft error occurs. If any one of the writing data D or the inverted data /D is inverted by a soft error, the writing data D and the inverted data /D will coincide with each other. The comparing section 12 outputs "1," for example, as a comparison result CO if the writing data D and the inverted data /D are different from each other or outputs "0" as a comparison result CO if the writing data D and the inverted data /D coincide with each other.

Figure 4:
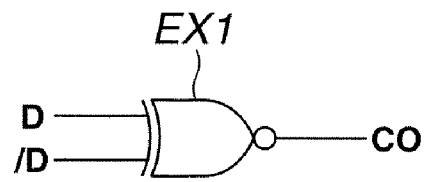
FIG. 4 is a circuit diagram showing one example of a comparing section related to the first embodiment of the present invention.
Figure 5:
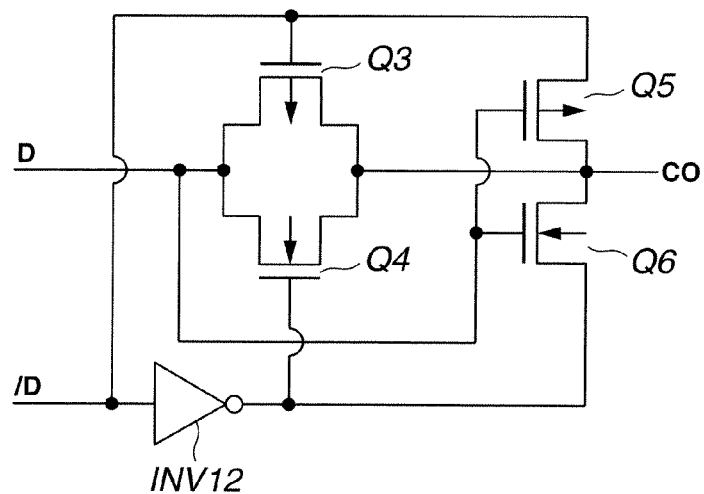
FIG. 5 is a circuit diagram showing one example of an exclusive OR circuit related to the first embodiment of the present invention.

A coincidence circuit composed of, for example, an exclusive OR circuit EX1 as shown in FIG. 4 may be used as the comparing section 12. As shown in FIG. 5, the exclusive OR circuit EX1 includes an inverter INV 12 connected to the output terminal of the inverted data generating section 11 shown in FIG. 1, a transfer section connected to the output terminal of the processor 1 and composed of a pMOS transistor Q3 and an nMOS transistor Q4 which are connected in parallel to each other and an output section connected to the common connecting point on the output side of the transistors Q3 and Q4 in the transfer section and composed of a pMOS transistor Q5 and an nMOS transistor Q6 which are connected in series to each other. The common connecting point on the output side of the transistors Q3 and Q4 is connected to the common connecting point (common drain) of the transistors Q5 and Q6, the common gate of the transistors Q5 and Q6 is connected to the output terminal of the processor 1, the gate of the transistor Q3 and the source of the transistor Q5 are connected to the output terminal of the inverted data generating section 11 and the gate of the transistor Q4 and the source of the transistor Q6 are connected to the output terminal of the inverter INV 12.

The data holding section 13 shown in FIG. 1 holds the writing data D outputted from the processor 1 according to the comparison result CO and outputs the held writing data D in synchronization with external clock signals CLK and /CLK inputted from an external terminal 15. For example, if a soft error does not occur and the comparison result CO is therefore "1," the data holding section 13 holds the writing data D outputted from the processor 1 and transfers a held writing data OUT to the storage circuit 2 in synchronization with the external clock signals CLK and /CLK. On the other hand, if a soft error occurs to cause the comparison result CO to be "0," the data holding section 13 neither receives the writing data D outputted from the processor 1 nor transfers the held writing data OUT to the storage circuit 2.

Figure 6:
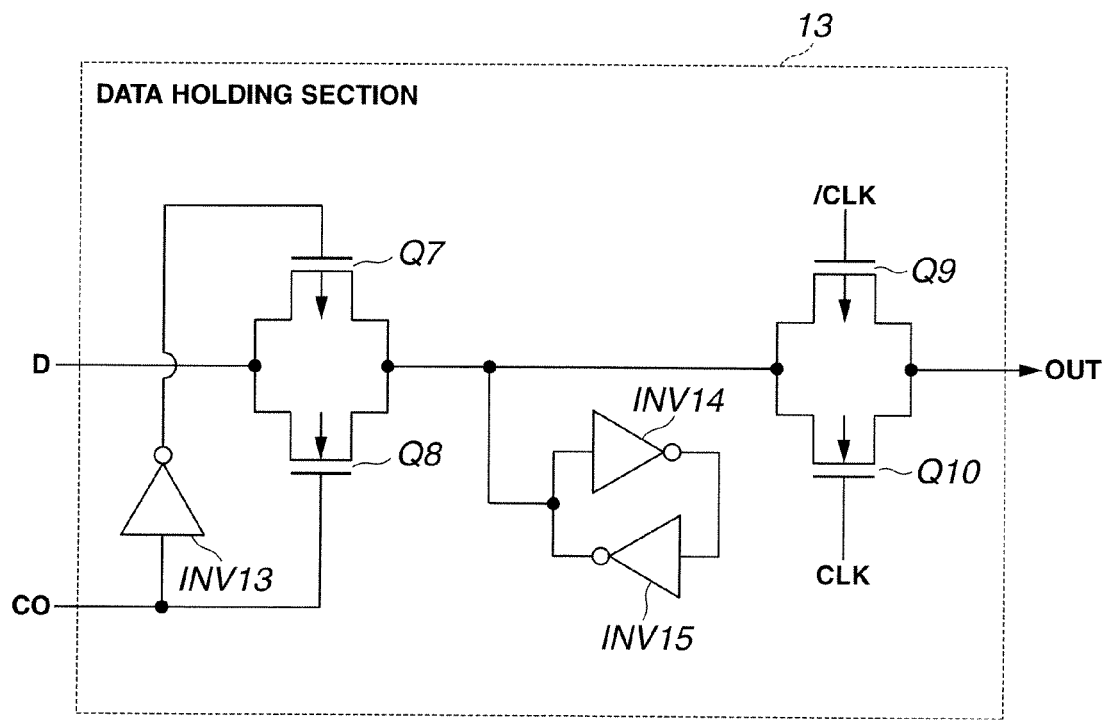
FIG. 6 is a circuit diagram showing one example of a data holding section related to the first embodiment of the present invention.

As shown in FIG. 6, the data holding section 13 includes an inverter INV 13 connected to the output terminal of the comparing section 12 shown in FIG. 1, a first transfer section connected to the output terminal of the processor 1 and composed of a pMOS transistor Q7 and an nMOS transistor Q8 which are connected in parallel to each other, a latch circuit connected to the common connecting point on the output side of the transistors Q7 and Q8 of the first transfer section and composed of two inverters INV 14 and INV 15 whose input and output terminals are inversely connected in parallel to each other and a second transfer section connected to the connecting point between the latch circuit and the first transfer section and composed of a pMOS transistor Q9 and an nMOS transistor Q10 which are connected in parallel to each other. The input terminal of the inverter INV 13 and the gate of the transistor Q8 are connected to the output terminal of the comparing section 12, the output terminal of the inverter INV 13 is connected to the gate of the transistor Q7, the gate of the transistor Q10 is supplied with the external clock signal CLK, the gate of the transistor Q9 is supplied with the external clock signal /CLK and the writing data OUT is outputted from the common connecting point on the output side of the transistors Q9 and Q10 to the storage circuit 2.

The error signal generating section 14 shown in FIG. 1 generates an error signal ERR requesting the processor 1 to output data again according to the comparison result CO. For example, if a soft error occurs to cause the comparison result CO to be "0," the error signal generating section 14 generates the error signal ERR requesting the processor 1 to output data again and transfers it to the processor 1. The processor 1 outputs the writing data D again in response to the error signal ERR. On the other hand, if a soft error does not occur to cause the comparison result CO to be "1," the error signal generating section 14 does not generate the error signal ERR.

Figure 7:
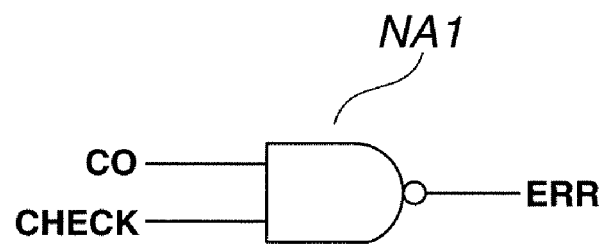
FIG. 7 is a circuit diagram showing one example of an error signal generating section related to the first embodiment of the present invention.
Figure 8:
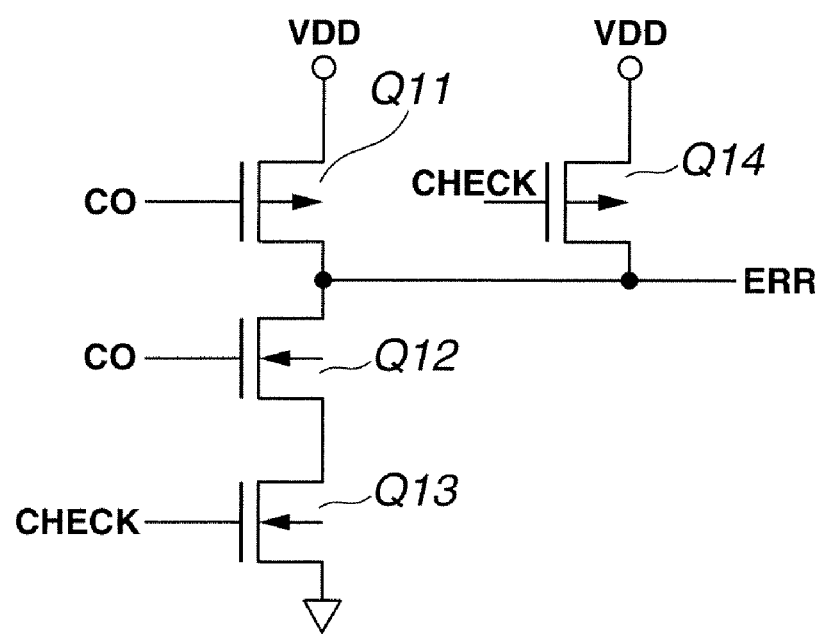
FIG. 8 is a circuit diagram showing one example of a NAND circuit related to the first embodiment of the present invention.

As shown in FIG. 7, a NAND circuit NA1 may be used as the error signal generating section 14. A signal CHECK inputted into the NAND circuit NA1 is transferred from an external terminal (not shown) or the processor 1 and is "1" for example. As shown in FIG. 8, the NAND circuit NA1 includes PMOS transistors Q11 and Q14 whose sources are connected to the power supply VDD and whose drains are connected to each other and nMOS transistors Q12 and Q13 connected in series between the common drain of pMOS transistors Q11 and Q14 and the ground. The comparison result CO from the comparing section 12 is inputted into the gate of the transistors Q11 and Q12, the source of the transistor Q13 is grounded and the signal CHECK is inputted into the gate of the transistors Q13 and Q14. If the signal CHECK is "1," the error signal ERR is generated as long as the comparison result CO is "0."

Incidentally, the semiconductor integrated circuit shown in FIG. 1 further includes various peripheral circuits (not shown) such as a circuit to read data from the storage circuit 2 to the processor 1, input circuit, output circuit, interface circuit and others.

Figure 9:
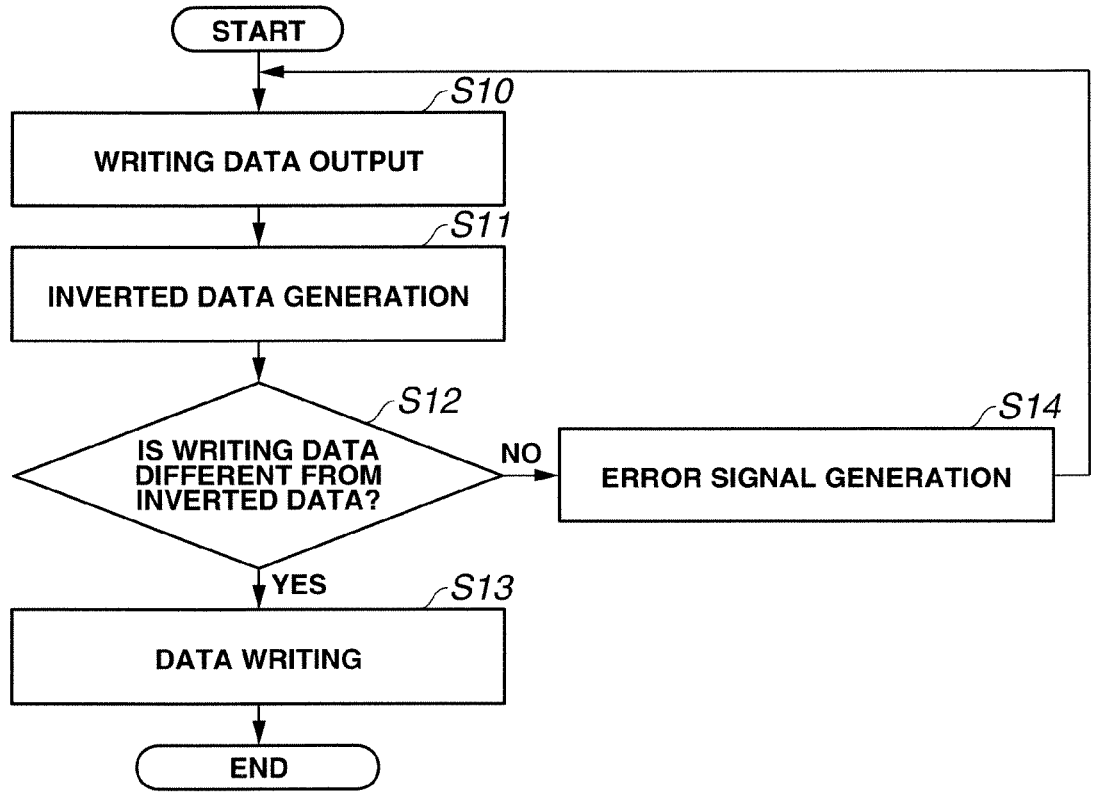
FIG. 9 is a flow chart describing one example of a data writing method related to the first embodiment of the present invention.

Next, a method of writing data related to the first embodiment of the present invention is described with reference to the flow chart in FIG. 9.

(a) In step S10, the processor 1 shown in FIG. 1 generates the writing data D, a control signal WR and an address signal AD. In step S11, the inverted data generating section 11 inverts the writing data D to generate the inverted data /D.

(b) In step S12, the comparing section 12 compares the writing data D with the inverted data /D. If a soft error does not occur and the writing data D and the inverted data /D are correct values, the writing data D and the inverted data /D will be different from each other. If any one of the writing data D or the inverted data /D is inverted by a soft error, the writing data D and the inverted data /D will coincide with each other. Then, the comparing section 12 outputs the comparison result CO.

(c) In step S13, if the writing data D and the inverted data /D are different from each other in step S12, the data holding section 13 latches the writing data D and transfers the latched writing data OUT to the storage circuit 2 in synchronization with the external clock signals CLK and /CLK.

(d) In step S14, on the other hand, if the writing data D and the inverted data /D coincide with each other in step S12, the data holding section 13 keeps holding the writing data D and the error signal generating section 14 generates the error signal ERR to be transferred to the processor 1. The process returns to Step S10, and the processor 1 again generates the writing data D in response to the error signal ERR to supply it again to the data holding section 13.

According to the first embodiment of the present invention, the writing data D is compared with the inverted data /D to check the influence of a soft error, thereby enables further suppressing increase in circuit scale as compared with cases where the ECC circuit is added or the majority decision system requiring a plurality of latch circuits is adopted and preventing the malfunction of a circuit caused by a soft error.

That is to say, since the majority decision system using a plurality of latch circuits described in related art herein stores the same data of, for example, "1" in a plurality of latch circuits, if the data of "1" in one latch circuit is changed to "0," the data in the other latch circuits also may probably be changed to "0" (because any latch circuit has the same structure and properties). Therefore, determining whether data is correct or not using the majority decision system may probably lead to an incorrect soft-error determination itself. On the other hand, in the first embodiment, even if one out of two data to be compared in the comparing section 12, i.e., the data read by the inverted data generating section 11, is not inverted due to a soft error to be outputted as "1", the other data of "1" inputted into the comparing section 12 may have little probability of change to "0" (because the data outputted from the processor 1 is directly supplied to the comparing section 12 not through an electronic circuit), as a result, this may probably not lead to an incorrect soft-error determination itself. In other words, in the first embodiment of the present invention, it can be said that both data inputted into the comparing section 12 will never be inverted at the same time, which provides higher reliability of determination result compared with the conventional majority decision system.

Incidentally, if a plurality of soft-error protecting circuits need to be mounted on a semiconductor integrated circuit such as LSI, only the comparing circuits of neighboring plural soft-error protecting circuits are made common to form only one circuit. The comparing section is used while being switched, which allows the entire circuit scale to be made smaller than that of an ECC circuit, which is advantageous in circuit scale.

Second Embodiment

Figure 10:
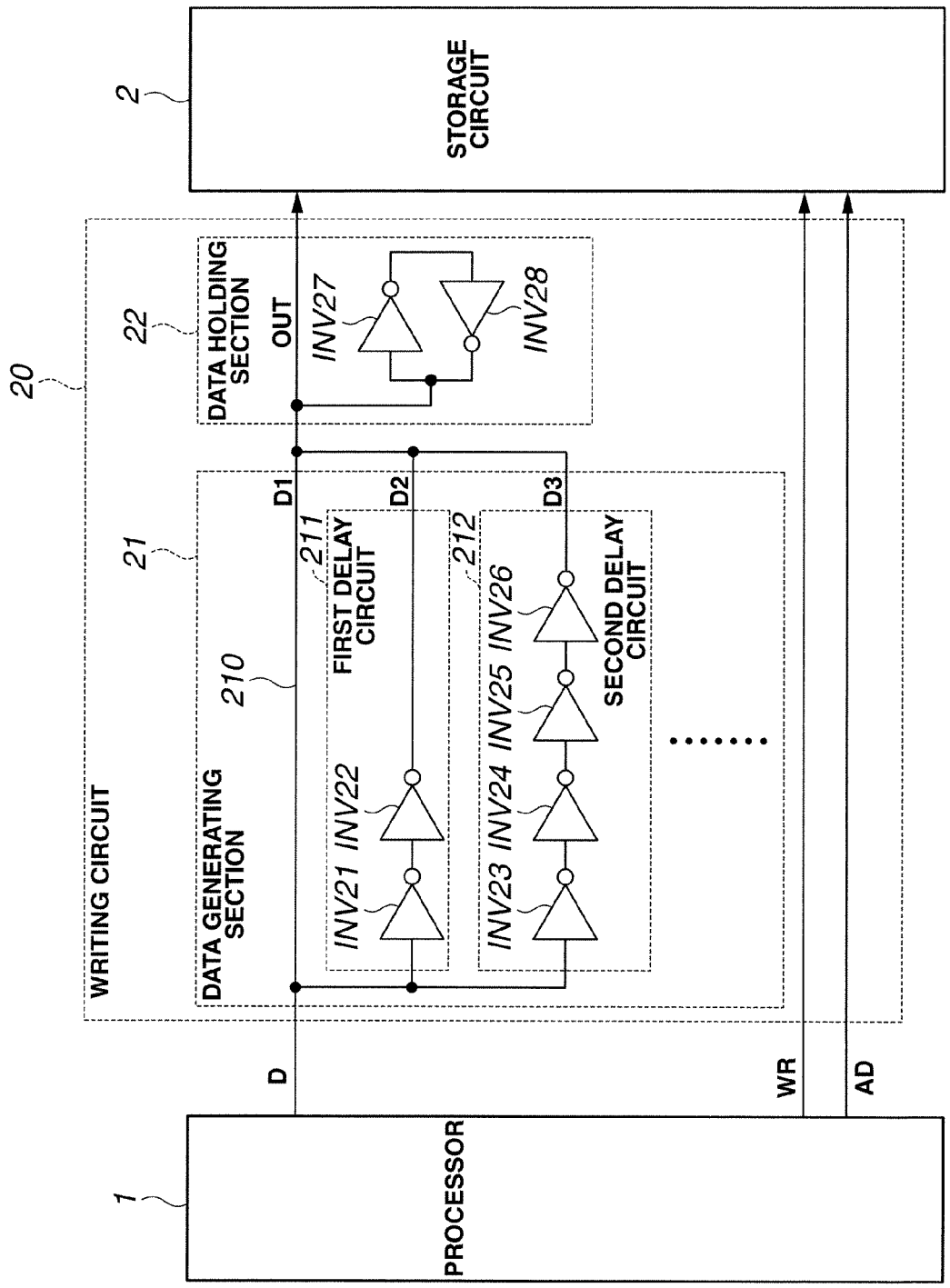
FIG. 10 is a block diagram showing one example of a semiconductor integrated circuit related to a second embodiment of the present invention.

As shown in FIG. 10, the semiconductor integrated circuit related to the second embodiment of the present invention includes the processor 1, a writing circuit 20 configured to sequentially generate the writing data D outputted from the processor 1 plural times, overwrite and hold the plural-times generated writing data D1, D2 and D3 and output the held writing data OUT, and the storage circuit 2 configured to store the written data OUT outputted from the writing circuit 20.

The writing circuit 20 includes a data generating section 21 connected to the processor 1 and a data holding section 22 connected to the data generating section 21 and the storage circuit 2.

The data generating section 21 receives the writing data D outputted from the processor 1 and sequentially generates it plural times as the writing data D1, D2 and D3. The data generating section 21 is connected in parallel to the output terminal of the processor 1 and includes plural (first and second) delay circuits 211 and 212 delaying the writing data outputted from the processor 1 by a predetermined time. The first delay circuit 211 includes two inverters INV 21 and INV 22 connected in series to each other. The second delay circuit 212 includes four inverters INV 23, INV 24, INV 25 and INV 26 connected in series to each other. The data holding section 22 is a latch circuit composed of, for example, inverters INV 27 and INV 28.

Figure 11:
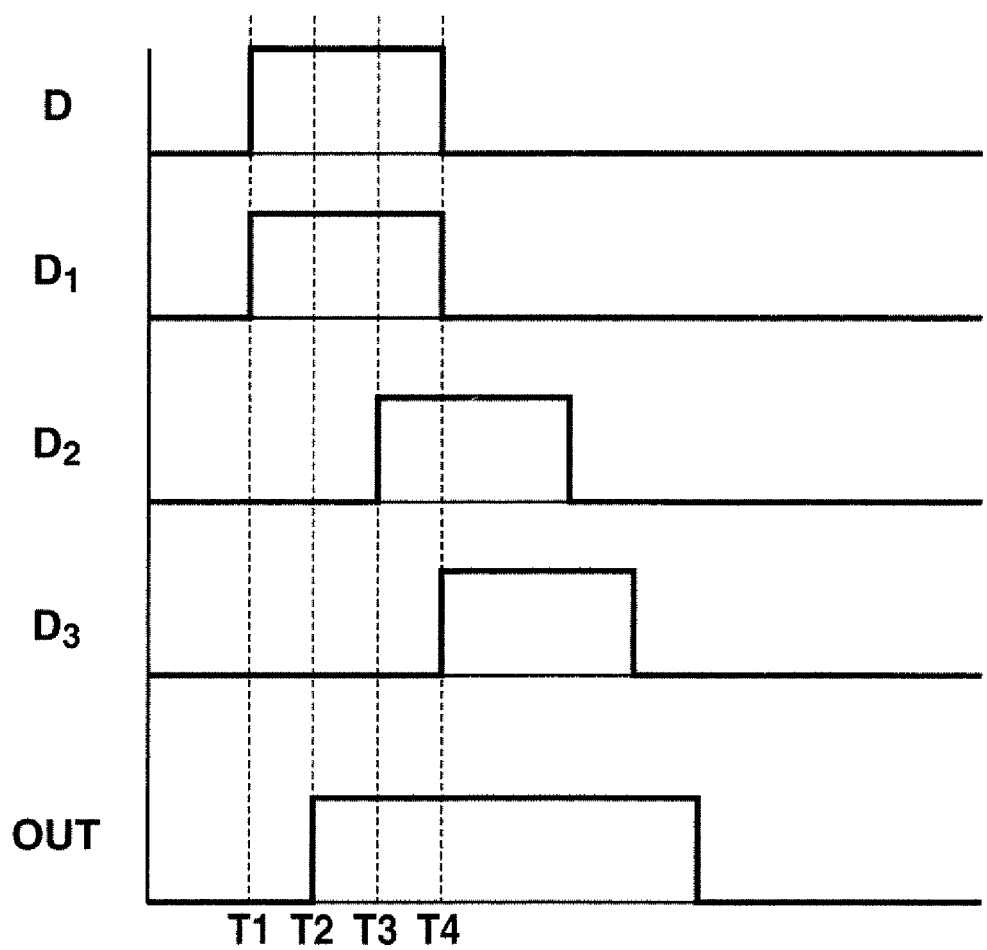
FIG. 11 is a timing chart describing one example of a data writing method related to the second embodiment of the present invention.

Next, a method of writing data related to the second embodiment of the present invention is described with reference to the timing chart in FIG. 11.

(a) At T1, the processor 1 generates and outputs the control signal WR, an address signal AD and a writing data D. The writing data D is transferred as a writing data D1 to the data holding section 22 through a wiring 210 of the data generating section 21 directly connected to the processor 1. At T2, the data holding section 22 holds the writing data D1 and transfers the held writing data OUT to the storage circuit 2.

(b) At T3, the writing data D outputted from the processor 1 is transferred as a writing data D2 to the data holding section 22 through the first delay circuit 211. Thereafter, the data holding section 22 overwrites the writing data D2 on the held writing data D1 to hold it and transfers the held writing data OUT to the storage circuit 2. At T4, the writing data D outputted from the processor 1 is transferred as a writing data D3 to the data holding section 22 through the second delay circuit 212. Thereafter, the data holding section 22 overwrites the writing data D3 on the held writing data D2 to hold it and transfers the held writing data OUT to the storage circuit 2.

When data is written, data is normally written only once in the latch circuit of the data holding section. When data is written only once, if the data is destroyed by a soft error, incorrect data remains written. According to the second embodiment of the present invention, when data is written, a plurality of writing data D1, D2 and D3 are repetitively transferred to continuously overwrite the data even if the data is inverted due to a soft error. Therefore, even though any one of the data is destroyed by a soft error, the data holding section 22 is capable of correctly receiving the data. That is to say, since data are repetitively overwritten plural times, the final overwriting makes the data probably correct even if a soft error occurs at some stage out of plural times.

While FIG. 10 shows the first and the second delay circuits 211 and 212, a third delay circuit in which six inverters are further connected in series to each other, a fourth delay circuit in which eight inverters are connected in series to each other, . . . n-th delay circuit in which (n×2) inverters are connected in series to each other (where "n" is an integer of one or more) may be provided as required.

(Modifications)

Figure 12:
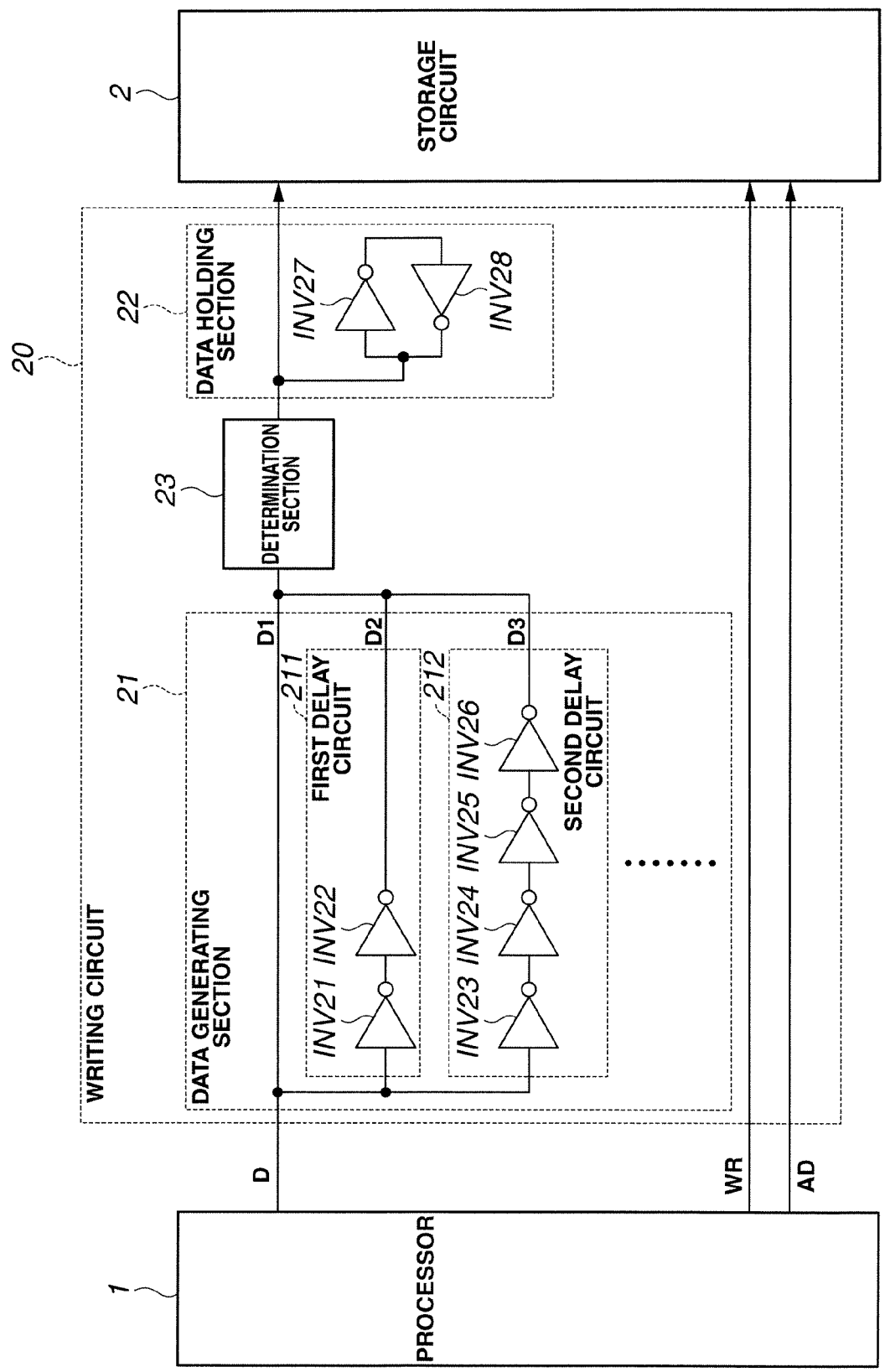
FIG. 12 is a block diagram showing one example of a semiconductor integrated circuit related to a modified second embodiment of the present invention.

As shown in FIG. 12, the writing circuit 20 may further include a determination section 23 between the data generating section 21 and the data holding section 22 as a modified second embodiment of the present invention.

The determination section 23 receives plural writing data D1, D2 and D3 outputted from the data generating section 21 and determines whether two or more data have the same value. When two or more data with the same value are received, the writing data are written in the data holding section 22. Alternatively, the determination section 23 receives plural writing data D1, D2 and D3 outputted from the data generating section 21 and determines whether successive values are the same. If the successive values are the same, the writing data may be written in the data holding section 22.

According to the modified second embodiment of the present invention, if any one of the writing data D1, D2 and D3 is destroyed by a soft error, correct data can be written into the data holding section 22 by the other two writing data.

Third Embodiment

As shown in FIG. 13, the semiconductor integrated circuit related to the third embodiment of the present invention includes the processor 1, a writing circuit 30 configured to multiplex the writing data D outputted from the processor 1, decode the multiplexed writing data MD, hold the decoded writing data DD and output the held writing data OUT, and the storage circuit 2 configured to store the written data OUT outputted from the writing circuit 30.

The writing circuit 30 includes a multiplexing section 31 connected to the processor 1, a decoder 32 connected to the multiplexing section 31 and a data holding section 33 connected to the decoder 32.

The multiplexing section 31 multiplex the writing data D outputted from the processor 1 by adding a prescribed data thereto. For example, "10110" is multiplexed to the writing data D of "1" to output "110110."

The decoder 32 decodes the multiplexed writing data MD while referring to an expected value ED outputted from an external terminal 34 or the processor 1. For example, plural values obtained by inverting each bit of "110110" as well as "110110" of which all bits coincide therewith are prepared as the expected value ED for the multiplexed writing data MD of "110110." For this reason, even if any one of the multiplexed writing data MD of "110110" is inverted due to a soft error, "1" is outputted as the decoded writing data DD from the multiplexed writing data MD. If two or more data are inverted, the decoder 32 does not decode.

The data holding section 33 holds the decoded writing data DD from the decoder 32 and transfers the held writing data OUT to the storage circuit 2.

Next, a method of writing data related to the third embodiment of the present invention is described below.

(a) The processor 1 generates the writing data D. The multiplexing section 31 multiples the writing data D.

(b) The decoder 32 decodes the multiplexed writing data MD while referring to an expected value ED and outputs the decoded writing data DD.

(c) The data holding section 33 holds the decoded writing data DD outputted by the decoder 32 in synchronization with the external clock signal CLK and /CLK outputted from the external terminal 35 and transfers the held writing data OUT to the storage circuit 2.

According to the third embodiment of the present invention, multiplexing the writing data D may probably not produce an error in a specific bit on the writing data MD whose data length is increased, which enables dispersing and decreasing the influence of a soft error, improving the resistance to a soft error.

Incidentally, the multiplexing section 31 may add a parity bit when multiplexing the writing data D of "1" and the decoder 32 may check whether the multiplexed writing data MD is correct based on the parity bit.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit comprising:
   a logic circuit; and
   a writing circuit configured to receive a writing data outputted from the logic circuit, invert the writing data to generate an inverted data, compare the writing data with the inverted data and output the writing data if the writing data and the inverted data are different from each other, wherein
   the writing circuit comprises:
   an inverted data generating section configured to generate the inverted data,
   a comparing section configured to compare the writing data with the inverted data,
   a data holding section configured to hold the writing data outputted from the logic circuit if the writing data and the inverted data are different from each other and output the held writing data, and
   an error signal generating section configured to send the logic circuit an error signal requesting the logic circuit to output the writing data if the writing data coincides with the inverted data.

2. The semiconductor integrated circuit according to claim 1, wherein the data holding section does not receive the writing data if the writing data outputted from the logic circuit coincides with the inverted data.

3. The semiconductor integrated circuit according to claim 1, wherein the data holding section outputs the held writing data in synchronization with an external clock signal.

4. The semiconductor integrated circuit according to claim 1, wherein the inverted data generating section is a CMOS inverter.

5. The semiconductor integrated circuit according to claim 1, wherein the comparing section is composed of an exclusive OR circuit.

6. The semiconductor integrated circuit according to claim 5, wherein the exclusive OR circuit comprises:
   an inverter connected to the output terminal of the inverted data generating section;

a transfer section connected to the output terminal of the logic circuit and composed of a first pMOS transistor and a first nMOS transistor which are connected in parallel to each other; and an output section connected to the common connecting point on the output side of the two transistors in the transfer section and composed of a second pMOS transistor and a second nMOS transistor which are connected in series to each other; wherein the common connecting point on the output side of the first pMOS transistor and the first nMOS transistor is connected to the common connecting point of the second pMOS transistor and the second nMOS transistor, the common gate of the second pMOS transistor and the second nMOS transistor is connected to the output terminal of the logic circuit, the gate of the first pMOS transistor and the source of the second pMOS transistor are connected to the output terminal of the inverted data generating section and the gate of the first nMOS transistor and the source of the second nMOS transistor are connected to the output terminal of the inverter.

7. The semiconductor integrated circuit according to claim 1, wherein the data holding section comprises:

an inverter connected to the output terminal of the comparing section;

a first transfer section connected to the output terminal of the logic circuit and composed of a first pMOS transistor and a first nMOS transistor which are connected in parallel to each other;

a latch circuit connected to the common connecting point on the output side of the first pMOS transistor and the first nMOS transistor and composed of two inverters whose input and output terminals are inversely connected in parallel to each other; and a second transfer section connected to the connecting point of the latch circuit and the first transfer section and composed of a second pMOS transistor and a second nMOS transistor which are connected in parallel to each other, wherein the input terminal of the inverter and the gate of the first nMOS transistor are connected to the output terminal of the comparing section, the output terminal of the inverter is connected to the gate of the first pMOS transistor, the gate of the second nMOS transistor is supplied with the external clock signal, the gate of the second pMOS transistor is supplied with a signal inverted from the external clock signal and the writing data is outputted from the common connecting point on the output side of the second pMOS transistor and the second nMOS transistor.

8. The semiconductor integrated circuit according to claim 1, wherein the error signal generating section is composed of a NAND circuit to one input terminal of which a comparison result is inputted from the comparing section and to the other input terminal of which a logic high level is inputted.

9. The semiconductor integrated circuit according to claim 8, wherein the NAND circuit comprises:

a first and a second pMOS transistors the sources of which are connected to the power supply and the drains of which are connected to each other; and a first and a second nMOS transistors connected in series between the common drain of the first and the second pMOS transistor and the ground; wherein, the comparison result is inputted from the comparing section into the gate of the first pMOS transistor and the gate of the first nMOS transistor and the logic high level is inputted into the gate of the second pMOS transistor and the gate of the second nMOS transistor.

10. A semiconductor integrated circuit comprising:

a logic circuit; and a writing circuit configured to sequentially generate the writing data outputted from the logic circuit plural times, overwrite and hold the writing data generated plural times and output the held writing data wherein the writing circuit comprises:

a data generating section configured to sequentially generate the writing data outputted from the logic circuit plural times; and a data holding section configured to overwrite and hold the writing data generated plural times by the data generating section and output the held writing data.

11. The semiconductor integrated circuit according to claim 10, wherein the data generating section comprises a plurality of delay circuits connected in parallel to a wiring connecting the logic circuit to the data holding section and configured to delay the writing data outputted from the logic circuit by a predetermined time.

12. The semiconductor integrated circuit according to claim 11, wherein the plurality of delay circuits are configured by connecting, at least two or more, a first to n-th delay circuits in parallel and the n-th delay circuit is configured by connecting (n×2) inverters in series.

13. The semiconductor integrated circuit according to claim 10, wherein the writing circuit further comprises a determination section provided between the data generating section and the data holding section and configured to receive the plural writing data sequentially outputted plural times from the data generating section to determine whether two or more data have the same value, and write the writing data with the same value in the data holding section if two or more data with the same value are received.

14. The semiconductor integrated circuit according to claim 10, wherein the writing circuit further comprises a determination section provided between the data generating section and the data holding section and configured to receive the plural writing data sequentially outputted plural times from the data generating section to determine whether successive values are the same, and write the writing data with the same value in the data holding section if successive values are the same.

15. A semiconductor integrated circuit comprising:

a logic circuit; and a writing circuit configured to multiplex the writing data outputted from the logic circuit, decode the multiplexed writing data, hold the decoded writing data and output the held writing data, wherein the writing circuit comprises:

a multiplexing section configured to add a predetermined data to the writing data outputted from the logic circuit to perform multiplexing;

a decoder configured to decode the writing data multiplexed by the multiplexing section using an expected value; and a data holding section configured to hold the writing data decoded by the decoder in synchronization with an external clock signal and output the held writing data.

16. The semiconductor integrated circuit according to claim 15, wherein the multiplexing section adds a parity bit as a predetermined data to the writing data when multiplexing the writing data and the decoder checks whether the multiplexed writing data are correct using a parity bit.

* * * * *